(12) United States Patent
Cho et al.

(10) Patent No.: US 10,141,543 B2
(45) Date of Patent: Nov. 27, 2018

(54) METHOD FOR MANUFACTURING ELECTRONIC DEVICE

(71) Applicant: LG CHEM, LTD., Seoul (KR)

(72) Inventors: Yoon Gyung Cho, Daejeon (KR); Hyun Jee Yoo, Daejeon (KR); Suk Ky Chang, Daejeon (KR); Jung Sup Shim, Daejeon (KR); Seung Min Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/323,827

(22) Filed: Jul. 3, 2014

(65) Prior Publication Data

US 2014/0318707 A1    Oct. 30, 2014

Related U.S. Application Data

(63) Continuation of application No. PCT/KR2013/000110, filed on Jan. 7, 2013.

(30) Foreign Application Priority Data

Jan. 6, 2012 (KR) .......................... 10-2012-0002170
Jan. 7, 2013 (KR) .......................... 10-2013-0001834

(51) Int. Cl.
*B32B 37/00* (2006.01)
*H01L 51/52* (2006.01)
(Continued)

(52) U.S. Cl.
CPC ............ *H01L 51/5259* (2013.01); *B32B 3/04* (2013.01); *B32B 27/08* (2013.01); *B32B 27/18* (2013.01); *B32B 37/142* (2013.01); *B32B 43/00* (2013.01); *C09D 123/22* (2013.01); *C09D 163/00* (2013.01); *H01L 21/56* (2013.01); *H01L 23/293* (2013.01); *H01L 51/524* (2013.01); *H01L 51/5253* (2013.01); *H01L 51/56* (2013.01);
(Continued)

(58) Field of Classification Search
CPC ....... H01L 21/56; H01L 23/293; H01L 33/04; H01L 51/50; H01L 51/5246; H01L 51/5253; H01L 51/5259; H01L 51/56; B32B 37/142
USPC .................................................... 257/40, 100
See application file for complete search history.

(56) References Cited

U.S. PATENT DOCUMENTS 5,975,420 A * 11/1999 Gogami ........... G06K 19/07728
235/488
8,003,999 B2 * 8/2011 Cho ..................... H01L 51/5237
257/98
(Continued)

FOREIGN PATENT DOCUMENTS

EP    2123442 A1    11/2009
EP    2502962 A1 *  9/2012 ................ C08L 9/00
(Continued)

OTHER PUBLICATIONS

Machine translation of JP 2010-067355 date unknown.*
Machine translation of WO 2011/016408 date unknown.*
Machine translation of JP 2005179401 date unknown.*

*Primary Examiner* — John L Goff, II
(74) *Attorney, Agent, or Firm* — Dentons US LLP

(57) ABSTRACT

Provided is a method of manufacturing an electronic device. An electronic device having excellent moisture blocking property and durability may be provided by the method.

35 Claims, 2 Drawing Sheets

(51) Int. Cl.
  *H01L 23/29* (2006.01)
  *H01L 21/56* (2006.01)
  *B32B 27/08* (2006.01)
  *B32B 27/18* (2006.01)
  *H05B 33/04* (2006.01)
  *B32B 43/00* (2006.01)
  *H01L 51/56* (2006.01)
  *B32B 37/14* (2006.01)
  *C09D 123/22* (2006.01)
  *C09D 163/00* (2006.01)
  *B32B 3/04* (2006.01)
  *B32B 37/10* (2006.01)
  *B32B 37/12* (2006.01)
  *B32B 37/24* (2006.01)

(52) U.S. Cl.
  CPC .............. *H05B 33/04* (2013.01); *B32B 37/10* (2013.01); *B32B 2037/1223* (2013.01); *B32B 2037/243* (2013.01); *B32B 2307/54* (2013.01); *B32B 2307/7265* (2013.01); *B32B 2309/02* (2013.01); *B32B 2309/04* (2013.01); *B32B 2309/10* (2013.01); *B32B 2309/105* (2013.01); *B32B 2310/0831* (2013.01); *B32B 2315/08* (2013.01); *B32B 2457/00* (2013.01); *B32B 2457/20* (2013.01); *B32B 2457/206* (2013.01); *H01L 2924/0002* (2013.01); *Y10T 156/10* (2015.01); *Y10T 428/24942* (2015.01); *Y10T 428/31511* (2015.04); *Y10T 428/31931* (2015.04); *Y10T 428/31938* (2015.04)

(56) References Cited

U.S. PATENT DOCUMENTS

| | | |
|---|---|---|
| 2004/0213973 A1 | 10/2004 | Hara et al. |
| 2006/0158111 A1 | 6/2006 | Hayashi |
| 2008/0238303 A1* | 10/2008 | Lee .................... H01L 51/5246 313/504 |
| 2008/0284331 A1 | 11/2008 | Hayashi |
| 2009/0020779 A1* | 1/2009 | Yamada ............... B29C 43/146 257/100 |
| 2011/0036623 A1* | 2/2011 | Keite-Telgenbuscher ................... C09J 153/025 174/260 |
| 2011/0157540 A1 | 6/2011 | Jung et al. |
| 2011/0266578 A1 | 11/2011 | Kanisawa et al. |

FOREIGN PATENT DOCUMENTS

| | | | |
|---|---|---|---|
| EP | 2637229 A2 | 9/2013 | |
| EP | 2781568 A1 | 9/2014 | |
| GB | 2417599 A | 3/2006 | |
| JP | 61-260204 A | 11/1986 | |
| JP | 9-274990 A | 10/1997 | |
| JP | 2001-68266 A | 3/2001 | |
| JP | 2002-260847 A | 9/2002 | |
| JP | 2004-18579 A | 1/2004 | |
| JP | 2004-327623 A | 11/2004 | |
| JP | 2005179401 A * | 7/2005 | |
| JP | 2007-42616 A | 2/2007 | |
| JP | 2008-260849 A | 10/2008 | |
| JP | 2010067355 A * | 3/2010 | |
| JP | WO 2011062167 A1 * | 5/2011 | ............... C08L 9/00 |
| KR | 10-2006-0084743 A | 7/2006 | |
| KR | 10-2008-0074601 A | 8/2008 | |
| KR | 10-2008-0101704 A | 11/2008 | |
| KR | 2011-0098689 A | 9/2011 | |
| KR | 10-1089631 B1 | 12/2011 | |
| TW | 201024389 A | 7/2010 | |
| TW | 201139148 A | 11/2011 | |
| WO | 2010098273 A1 | 9/2010 | |
| WO | 2011/016408 A1 | 2/2011 | |
| WO | 2012030494 A2 | 3/2012 | |
| WO | 2014069398 A1 | 5/2014 | |

* cited by examiner

METHOD FOR MANUFACTURING ELECTRONIC DEVICE

This application is a Bypass Continuation Application of International Application No. PCT/KR2012/000110, filed Jan. 7, 2013, and claims priority to Korean Application Nos. 10-2012-0002170 filed Jan. 6, 2012 and 10-2013-0001834 filed Jan. 7, 2013, all of which are hereby incorporated by reference in its entirety.

The present application relates to copending application Ser. No. 14/244,693, filed on Apr. 3, 2014; Ser. No. 14/323,703, filed on Jul. 3, 2014; and Ser. No. 14/323,867, filed on Jul. 3, 2014.

BACKGROUND

1. Field of the Invention

The present invention relates to a method of manufacturing an electronic device.

2. Discussion of Related Art

The electronic diode or device may be protected by an encapsulating film since it is sensitive to an external factor such as moisture or oxygen. The diode or device which may be protected by the encapsulating film may include, for example, an organic electronic device, a solar cell or a secondary battery such as a lithium secondary battery may be included. Particularly, among the diodes or devices, the organic electronic device is vulnerable to an external factor such as moisture or oxygen.

The organic electronic device is a device including a functional organic material. As the organic electronic device or an organic electronic diode included in the organic electronic device, a photovoltaic device, a rectifier, a transmitter or an organic light emitting diode (OLED) may be used.

The organic electronic device is generally vulnerable to an external factor such as moisture. For example, the OLED usually includes a layer of a functional organic material present between a pair of electrodes including a metal or metal oxide, and the layer of an organic material is detached due to an effect of moisture penetrating from an external environment at an interface with the electrode, is increased in resistance value due to oxidation of an electrode by moisture, or is degenerated, thereby causing problems such as a loss of an emissive function or a decrease in luminescence.

SUMMARY OF THE INVENTION

The present invention is directed to providing a method of manufacturing an electronic device.

One aspect of the present invention provides a method of manufacturing an electronic device that comprises laminating an encapsulating film in which a first layer and a second layer are stacked on a diode such that the second layer is in contact with the diode. The method of manufacturing an electronic device can provide a device having excellent moisture blocking property by using the encapsulating film in which the first and second layers are stacked.

Hereinafter, the encapsulating film will be described.

The encapsulating film may include at least one of each of the first and second layers, and further include a separate layer in addition to the first and second layers.

In one example, the first layer may include a pressure-sensitive adhesive (PSA) component, and the second layer may include an adhesive composition.

The term "pressure-sensitive adhesive component (PSA)" used herein may refer to a component which ensures stickiness at room temperature, is adhered by supply of a pressure and not activated by heat, water or a solvent, exhibits a strong maintaining strength after adhesion, and ensures a cohesive strength and elasticity. The term "adhesive component" used herein may refer to a component capable of, unlike the PSA component, providing a permanent adhesion rather than a temporary adhesion, that is, a composition generally present in a liquid phase to be applied to adhere, solidified, cooled or cured, thereby exhibiting an adhesive strength, and physically destroyed when an object to be adhered after adhesion is separated.

The encapsulating film includes first and second layers having different physical properties and/or components. The film may be laminated on a diode without bubbles even when applied to a large-scale device to protect the diode, and effectively protect the diode from an external factor, for example, moisture, after encapsulation. The encapsulating film may have various structures such as a structure in which a second layer 11 is disposed on one surface of a first layer 12 as shown in FIG. 1. Here, the structure in which the first layer 12 and the second layer 11 are stacked may include a structure in which the second layer 11 is directly attached to the first layer 12, and a structure in which the second layer 11 is indirectly attached to the first layer 12 via another additional layer.

In the encapsulating film, the first layer may have a lower elastic modulus than the second layer. For example, the tensile modulus of the first layer may be lower than that of the second layer. Unless particularly defined otherwise, the tensile modulus used herein is measured at 25° C. In addition, the tensile modulus with respect to a curable component used herein is, unless particularly defined otherwise, a tensile modulus measured after curing.

When the elastic modulus of the first layer is lower than that of the second layer, the encapsulating film is preferable to be applied to a large-scale device, and an effective moisture blocking property can be provided to the film as result of controlling a ratio of a moisture scavenger between the first and second layers. The term "moisture scavenger" used herein may refer to a material capable of removing moisture or vapor penetrating the encapsulating film through a chemical reaction with the water or vapor. Usually, when the moisture scavenger is reacted with moisture in the film, a volume expands to the extent of the reaction with moisture, thereby generating a stress. Accordingly, if the tensile modulus is not sufficient to reduce an expansion stress generated during the removal of moisture, the film may be detached from an adherent or induce inter-layer detachment in the case of a multilayer structure. For example, when the elastic modulus of the film is controlled to decrease, the detachment due to the stress may be prevented. However, when the elastic modulus is controlled by reducing a glass transition temperature through simply controlling a curing degree, a water vapor transmission rate (WVTR) of the film may be increased. However, when two layers having different elastic moduli are stacked and a moisture scavenger is mainly included in the layer having a lower elastic modulus of the two layers as described above, moisture penetrating through the layer having a relatively smaller amount of the moisture scavenger, that is, the layer having a higher elastic modulus, may be diffused to the layer having a lower elastic modulus, thereby enhancing a moisture blocking property. In addition, other physical properties such as durability of the film may also be satisfied. In one example, the tensile modulus of the first layer may be approximately 0.001 to 100 Mpa, 0.001 to 80 Mpa, 0.001 to 60 Mpa, 0.001 to 40 Mpa, 0.001 to 20 Mpa, 0.001 to 10 Mpa, 0.001 to 5 Mpa, 0.001 to 3 Mpa, 0.001 to 1 Mpa, 0.005 to 100 Mpa, 0.01 to 100 Mpa, 0.05 to 100 Mpa, 0.1 to 100 Mpa, 0.2 to 100 Mpa, 0.3 to 100 Mpa, 0.005 to 80 Mpa, 0.01 to 60 Mpa, 0.05 to 40 Mpa, 0.05 to 20 Mpa, 0.1 to 10 Mpa, 0.1 to 5 Mpa, 0.2 to 3 Mpa or 0.3 to 1 Mpa. In addition, the tensile modulus of the second layer may be approximately 200 to 1000 Mpa, 300 to 1000 Mpa, 300 to 900 Mpa, 300 to 800 Mpa, 300 to 700 Mpa, 400 to 1000 Mpa, 500 to 1000 Mpa, 550 to 1000 Mpa, 400 to 900 Mpa, 500 to 800 Mpa or 550 to 700 Mpa. In the above range, the first layer may have a lower elastic modulus than the second layer. For example, a ratio (M1/M2) of the tensile modulus (M1) of the first layer to the tensile modulus (M2) of the second layer may be approximately $1 \times 10^{-6}$ to 0.5, $1 \times 10^{-6}$ to 0.4, $1 \times 10^{-6}$ to 0.3, $1 \times 10^{-6}$ to 0.2, $10 \times 10^{-6}$ to 0.5, $100 \times 10^{-6}$ to 0.5, $200 \times 10^{-6}$ to 0.5, $300 \times 10^{-6}$ to 0.5, $400 \times 10^{-6}$ to 0.5, $500 \times 10^{-6}$ to 0.5, $10 \times 10^{-6}$ to 0.4, $100 \times 10^{-6}$ to 0.4, $200 \times 10^{-6}$ to 0.3, $300 \times 10^{-6}$ to 0.3, $400 \times 10^{-6}$ to 0.2 or $500 \times 10^{-6}$ to 0.2. In the relationship of the elastic modulus described above, the encapsulating film may also be effectively applied to a large-scale device, and easily controlled in a ratio of the moisture scavenger between the layers, which is preferable to control physical properties of the film.

In one example, the encapsulating layer may include a moisture scavenger. In this case, the first layer may include a larger amount of moisture scavenger than the second layer. The second layer may include a smaller amount of the moisture scavenger than the first layer, or may not include the moisture scavenger. As will be described later, in the above structure, for example, when the second layer has an encapsulating structure is realized such that the second layer is in contact with a diode, the diode may not be damaged, and an excellent moisture or vapor blocking property may be exhibited. For example, the first layer may include a moisture scavenger at 5, 10, 20 or 25 parts by weight or more with respect to 100 parts by weight of the PSA component. The upper limit of the ratio of the moisture scavenger in the first layer may be changed according to a desired moisture blocking property, and the first layer may include a moisture scavenger at 250, 230 or 210 parts by weight or less with respect to the PSA component, but the present invention is not particularly limited thereto. The second layer may not include the moisture scavenger, or otherwise may include a trace amount of the moisture scavenger. The second layer may include the moisture scavenger, for example, at less than 5 or 3 parts by weight with respect to 100 parts by weight of a solid content of the second layer. Since the second layer may not include a moisture scavenger, the lower limit of the content of the moisture scavenger in the second layer may be 0 parts by weight. Unless particularly defined otherwise, the unit "parts by weight" used herein refers to a weight ratio.

Thicknesses of the first and second layers may be controlled in consideration of the number of layers included in the film or a use of the film. For example, when the film includes one of each of the first and second layers, the thickness of the first layer may be approximately 5 to 100 μm, and the thickness of the second layer may be approximately 2 to 30 μm. In this range, the film having excellent moisture blocking property, workability and durability may be provided.

In one example, the first layer may include a PSA component having a contact angle of 80, 85, 90 or 95 degrees or more with respect to deionized water. The contact angle is a contact angle measured after a layer is formed by coating a glass with a solution containing approximately 15 wt % of a solid content prepared by dissolving the PSA component for the first layer in a suitable solvent and drying the coated solution, and deionized water is dropped onto the coating layer at approximately 25° C., and may be an average of contact angles measured by repeating the above process 10 times. As the component whose contact angle is controlled as described above is included in the first layer, the film having excellent moisture blocking property and durability may be provided. The upper limit of the contact angle of the PSA component may be, but is not particularly limited to, for example, 150 or 120 degrees or less.

The first layer may also include a PSA component having a WVTR of 50 or 45 g/m²·day or less. The WVTR may be measured in a thickness direction of the film which is formed from the PSA component to have a thickness of 100 μm at 100° F. and a relative humidity of 100%. As the WVTR of the PSA component is controlled as described above, the film having an excellent moisture blocking property may be provided. As the WVTR of the first layer is lower, the film may have a better moisture blocking property, and thus the lower limit thereof is not particularly limited. For example, the lower limit of the WVTR of the PSA component may be 0 g/m²·day.

In one example, the PSA component included in the first layer may satisfy all of the above ranges of the contact angle and WVTR. As the first layer includes the component having the above ranges of the contact angle and WVTR, the film having excellent moisture blocking property and water repellency may be provided.

As the PSA component, any one of known components in the related art providing a first layer satisfying the above-mentioned contact angle and WVTR or the above-mentioned elastic modulus can be used without particular limitation. In addition, if a resin does not satisfy the contact angle and WVTR alone, but satisfies the contact angle and WVTR in combination with another resin, the combined resin may be used as the PSA component.

The component may be a styrene-based resin, a polyolefin-based resin, a thermoplastic elastomer, a polyoxyalkylene-based resin, a polyester-based resin, a polyvinyl chloride-based resin, a polycarbonate-based resin, a polyphenylenesulfide-based resin, a mixture of hydrocarbons, a polyamide-based resin, an acrylate-based resin, an epoxy-based resin, a silicon-based resin, a fluorine-based resin or a mixture thereof.

Here, the styrene-based resin may be, for example, a styrene-ethylene-butadiene-styrene block copolymer (SEBS), a styrene-isoprene-styrene block copolymer (SIS), an acrylonitrile-butadiene-styrene block copolymer (ABS), an acrylonitrile-styrene-acrylate block copolymer (ASA), a styrene-butadiene-styrene block copolymer (SBS), a styrene-based homopolymer or a mixture thereof. The olefin-based resin may be, for example, a high-density polyethylene-based resin, a low-density polyethylene-based resin, a polypropylene-based resin or a mixture thereof. The thermoplastic elastomer may be, for example, an ester-based thermoplastic elastomer, an olefin-based thermoplastic elastomer or a mixture thereof. Among these, the olefin-based thermoplastic elastomer may be a polybutadiene resin or a polyisobutene resin. The polyoxyalkylene-based resin may be, for example, a polyoxymethylene-based resin, a polyoxyethylene-based resin or a mixture thereof. The polyester-based resin may be, for example, a polyethylene terephthalate-based resin, a polybutylene terephthalate-based resin or a mixture thereof. The polyvinylchloride-based resin may be, for example, a polyvinylidene chloride. The mixture of hydrocarbons may be, for example, hexatriacotane or paraffin. The polyamide-based resin may be, for example, nylon. The acrylate-based resin may be, for example, a polybutyl(meth)acrylate. The epoxy-based resin may be, for example, a bisphenol type such as a bisphenol A-, bisphenol F-, or bisphenol S-type epoxy-based resin or a hydrogenated product thereof; a novolac type such as a phenolnovolac- or cresolnovolac-type epoxy-based resin; a nitrogen-containing cyclic type such as a cyclic triglycidylisocyanurate- or hydantoin-type epoxy-based resin; an alicyclic type; an aliphatic type; an aromatic type such as a naphthalene-type epoxy-based resin or a biphenyl-type epoxy-based resin; a glycidyl type such as a glycidylether-type epoxy-based resin, a glycidylamine-type epoxy-based resin, or a glycidylester-type epoxy-based resin; a dicyclo type such as dicyclopentadiene-type epoxy-based resin; an ester type; an etherester type; or a mixture thereof. The silicon-based resin may be, for example, a polydimethylsiloxane. In addition, the fluorine-based resin may be a polytrifluoroethylene resin, a polytetrafluoroethylene resin, a polychlorotrifluoroethylene resin, a polyhexafluoropropylene resin, a polyvinylidene fluoride, a polyvinyl fluoride, a polyethylene propylene fluoride or a mixture thereof.

The resin may be grafted with maleic acid anhydride, copolymerized with another resin listed above or a monomer for preparing a resin, or modified by another compound, which may be a carboxyl-terminal end butadiene-acrylonitrile copolymer.

In addition, the listed resin may include at least one heat-curable functional group or site such as a glycidyl, isocyanate, hydroxyl, carboxyl or amide group, or at least one active energy ray-curable functional group or site such as an epoxide, cyclic ether, sulfide, acetal or lactone group to exhibit a suitable cohesive strength after curing.

In one example, the first layer may include a polyisobutene resin. The polyisobutene resin may exhibit low WVTR and surface energy due to hydrophobicity. Particularly, the polyisobutene resin may be, for example, a homopolymer of an isobutylene monomer; or a copolymer prepared by copolymerizing another monomer which can be polymerized with an isobutylene monomer. Here, the monomer which can be polymerized with an isobutylene monomer may be, for example, 1-butene, 2-butene, isoprene or butadiene.

The PSA component may be a resin having a weight average molecular weight (Mw) at which it can be molded in a film type. In one example, the range of the weight average molecular weight at which molding in a film type is possible may be approximately 100,000 to 2,000,000, 100,000 to 1,500,000 or 100,000 to 1,000,000. The term "weight average molecular weight (Mw)" used herein refers to a conversion value with respect to a standard polystyrene measured by gel permeation chromatography (GPC).

In addition, as the PSA component, one or at least two of the above resins may be used. When at least two resins are used, the resins may be different in kind, weight average molecular weight or both.

The first layer may further include a moisture scavenger in addition to the PSA component. Thus, the moisture blocking property of the first layer may be more enhanced.

In one example, the moisture scavenger may be present in a uniformly dispersed state in the PSA component. Here, the uniformly dispersed state may refer to a state in which the moisture scavenger is present at the same or substantially the same density in any part of the PSA component. The moisture scavenger capable of being used herein may be, for example, a metal oxide, a sulphate or an organic metal oxide. Particularly, the metal oxide may be magnesium oxide, calcium oxide, strontium oxide, barium oxide or aluminum oxide, the sulphate may be magnesium sulphate, sodium sulphate or nickel sulphate, and the organic metal oxide may be aluminum oxide octylate. The moisture scavenger which may be included in the first layer may use one or at least two of the above materials. In one example, when at least two materials are used for the moisture scavenger, calcined dolomite may be used.

Such a moisture scavenger may be controlled in a suitable size according to a use of the film. In one example, an average particle diameter of the moisture scavenger may be controlled to approximately 10 to 15,000 nm. Since a response rate with moisture is not excessively high, the moisture scavenger having a size within the above range may be easily stored, may not damage a diode to be encapsulated, and may effectively remove moisture.

A content of the moisture scavenger may be controlled to, for example, 5 to 250 parts by weight with respect to 100 parts by weight of the PSA component as described above.

In addition, in one example, the first layer may further include a dispersing agent such that the moisture scavenger is uniformly dispersed in the PSA component. As the dispersing agent capable of being used herein, a non-ionic surfactant having an affinity to a hydrophilic surface of the moisture scavenger and a compatibility with the PSA component may be used. In one example, as the non-ionic surfactant, a compound represented by Formula 1 may be used.

$$R-X \qquad \text{[Formula 1]}$$

In Formula 1, R is a saturated or unsaturated hydrocarbon group, and X is a hydroxyl group, a carboxyl group, an amino group or a carbohydrate residue.

In Formula 1, R may be a saturated or unsaturated hydrocarbon group having 4 to 28, 4 to 24, 4 to 20 or 6 to 20 carbon atoms.

In addition, the compound of Formula 1 in which X is a carbohydrate residue may refer to a compound in which one of hydrogen atoms in the carbohydrate is substituted with R. The carbohydrate may be, for example, glucose.

The compound of Formula 1 may be, for example, a fatty acid such as stearic acid, palmitic acid, oleic acid or linoleic acid; a fatty alcohol such as cetyl alcohol, stearyl alcohol, cetostearyl alcohol or oleyl alcohol; or an alkyl glucoside such as octyl glucoside, decyl glucoside or lauryl glucoside.

A content of the dispersing agent may be controlled according to the kind and/or size of a moisture scavenger. Particularly, as the size of the moisture scavenger is decreased, a surface area of the moisture scavenger is increased, and thus a large amount of the dispersing agent is needed to uniformly disperse the moisture scavenger. In one example, when a moisture scavenger having an average particle diameter of approximately 40 nm is used, approximately 5 parts by weight of the dispersing agent may be used based on 100 parts by weight of the moisture scavenger. In one example, when a moisture scavenger having an average particle diameter of approximately 1,000 nm is used, approximately 0.05 parts by weight of the dispersing agent may be used based on 100 parts by weight of the moisture scavenger. Accordingly, in consideration of the above-described kind and/or size of the moisture scavenger, approximately 0.01 to 500 parts by weight of the dispersing agent may be used based on 100 parts by weight of the moisture scavenger. In this range, the moisture scavenger may be uniformly dispersed with no influence on any physical properties including an adhesive strength of the film.

A method of including the moisture scavenger and the dispersing agent in the first layer may be any method used in the related art without particular limitation, and may be a method capable of uniformly dispersing the moisture scavenger in the PSA component by controlling a mixing sequence. First, a dispersing solution is prepared by dispersing the dispersing agent in a solvent. Here, the solvent may be selected based on coatability, drying temperature or compatibility with the PSA component. In one example, when the polyisobutene resin is used as the PSA component, an aromatic solvent such as toluene or xylene may be used as a solvent. The moisture scavenger is added to and mixed with the dispersing solution. Here, as the process of mixing the moisture scavenger with the dispersing solution, a physical dispersion method may further be used to increase dispersity of the moisture scavenger. The physical dispersion method may be, for example, a method using a shaker, sonication or bead milling. A composition for forming the first layer may be obtained by adding the solution in which the moisture scavenger and the dispersing agent are dispersed to a solution including the PSA component. The solution in which the moisture scavenger and the dispersing agent are dispersed may be optionally filtered to screen large-sized particles, and then the filtered solution may be added to the solution including the PSA component. Through the above process, the first layer in which the moisture scavenger and the dispersing agent are uniformly dispersed in the PSA component may be formed. However, the process is not limited to that described above, and will be simply modified by one of ordinary skill in the art.

The first layer may further include a moisture blocker. The term "moisture blocker" used herein may refer to a material having no or low reactivity to moisture penetrating the film, but capable of preventing or interrupting migration of moisture or vapor into the film. As the moisture blocker, one or at least two of clay, talc, needle-shaped silica, planar silica, porous silica, zeolite, titania or zirconia may be used. In addition, the moisture blocker may be surface-treated by an organic modifier to facilitate penetration of an organic material. The organic modifier may be, for example, dimethyl benzyl hydrogenated tallow quaternary ammonium, dimethyl dihydrogenated tallow quaternary ammonium, methyl tallow bis-2-hydroxyethyl quaternary ammonium, dimethyl hydrogenated tallow 2-ethylhexyl quaternary ammonium, dimethyl dehydrogenated tallow quaternary ammonium or a mixture thereof.

A content of the moisture blocker that may be included in the first layer may be suitably controlled in the relationship with a matrix structure of the moisture scavenger and the PSA component. In one example, the content of the moisture blocker may be controlled to 0 to 50 parts by weight or 1 to 30 parts by weight with related to 100 parts by weight of the PSA component. In this range, the film having excellent moisture blocking property and mechanical properties may be provided.

In one example, the moisture scavenger and the moisture blocker may be uniformly dispersed in the PAS component by controlling the mixing sequence of the component for the first layer even when the first layer includes both the moisture scavenger and the moisture blocker.

For example, first, a first dispersing solution may be prepared by adding the moisture blocker to a solvent. Here, the first dispersing solution may be obtained in a dispersing solution in which the moisture blocker is uniformly dispersed through a process such as sonication, bead milling, ball milling, high-speed dispersion or high-pressure dispersion. Separately, as described above, a second dispersing solution in which the moisture scavenger and/or dispersing agent is (are) dispersed is prepared. The prepared first and second dispersing solutions are added to and mixed with the solution including the PSA component. During mixing, in consideration of the control in viscosity and coatability of the resin composition, a solvent may further be added. According to the method described above, the first layer in which the moisture scavenger and the blocker are uniformly dispersed may be formed. The method of forming the first layer can be changed with regard to aspects well known to one of ordinary skill in the art without limitation.

The first layer may further include a tackifier. As the tackifier, for example, a hydrogenated petroleum resin obtained by hydrogenating a petroleum resin may be used. The hydrogenated petroleum resin may be a partially or completely hydrogenated resin, or a mixture of such resins. As the tackifier, one having a good compatibility with the PSA component and an excellent moisture blocking property may be selected. A particular example of the hydrogenated petroleum resin may be a hydrogenated terpene-based resin, a hydrogenated ester-based resin or a hydrogenated dicyclopentadiene-based resin. The tackifer may have a weight average molecular weight of approximately 200 to 5,000. A content of the tackifier may be suitably controlled when necessary. For example, the tackifier may be included in the first layer at 5 to 100 parts by weight with respect to 100 parts by weight of the PSA component.

In addition to the components, various additives may be included in the first layer according to a use of the film and a process of forming the film. For example, in consideration of durability and processibility, a curable material may further be included in the first layer. Here, the curable material may refer to a material having a heat-curable functional group and/or active energy ray-curable functional group which are (is) included, in addition to the PSA component. In addition, a content of the curable material included in the first layer may be controlled according to a desired physical property of the film.

The second layer may includes an adhesive component. The second layer may be a hot melt-type adhesive layer. The term "hot melt-type adhesive layer" used herein may refer to a layer which may maintain a solid or semi-solid state at room temperature, may be melted when suitable heat is applied, thereby exhibiting a pressure-sensitive adhesive property, and may firmly fix a target material as an adhesive after curing. In addition, the term "curing of the adhesive" used herein may refer to a chemical or physical action or reaction changing the target material to have an adhesive property. In addition, the term "room temperature" may refer to a temperature in a natural state, which is not increased or decreased, for example, approximately 15 to 35° C., 20 to 25° C., 25° C. or 23° C. In addition, here, the maintenance of a solid or semi-solid state at room temperature may refer to the target material having a viscosity of approximately $10^6$ or $10^7$ poises or more at room temperature. Here, the viscosity is measured using an advanced rheometric expansion system (ARES). Here, the upper limit of the viscosity may be, but is not particularly limited to, for example, approximately $10^9$ poises or less.

For example, the second layer may maintain a solid or semi-solid state at room temperature even in a state in which a component included in the second layer such as an adhesive component is uncured. Accordingly, the second layer may include the adhesive component in a film type. As a result, excellent handleability may be obtained, physical or chemical damage to a diode during encapsulation may be prevented, and smooth working may progress.

The adhesive component may be, for example, a curable resin. As the curable resin, a heat-curable, active energy ray-curable or hybrid-curable resin known in the related art may be used. Herein, the term "heat-curable resin" may refer to a resin which may be cured through application of suitable heat or aging, the term "active energy ray-curable resin" may refer to a resin which may be cured by radiation of an active energy ray, and the term "hybrid-curable resin" may refer to a resin which may be cured by simultaneously or sequentially performing curing mechanisms for a heat-curable and active energy ray-curable resins. In addition, the active energy ray may be microwaves, an IR, UV or X ray, a gamma ray, or a particle beam such as an alpha-particle beam, proton beam, neutron beam or electron beam.

The curable resin is a resin exhibiting an adhesive property after curing, and may include at least one heat-curable functional group or site such as a glycidyl, isocyanate, hydroxyl, carboxyl or amide group, or at least one active energy ray-curable functional group or site such as an epoxide, cyclic ether, sulfide, acetal or lactone group. The curable resin may be, but is not limited to, an acrylic resin, polyester resin, isocyanate resin or epoxy resin having the at least one functional group or site described above.

In one example, the curable resin may be an epoxy resin. The epoxy resin may be an aromatic or aliphatic epoxy resin. As the epoxy resin, a heat-curable epoxy resin, or an active energy ray-curable epoxy resin, which is cured by cationic polymerization by radiation of an active energy ray, may be used.

The epoxy resin according to one example may have an epoxy equivalent of 150 to 2,000 g/eq. In the range of the epoxy equivalent, a characteristic such as adhesive performance or a glass transition temperature of a cured product may be maintained in an appropriate range.

In one example, the epoxy resin may be an aromatic epoxy resin. The term "aromatic epoxy resin" used herein may refer to an epoxy resin including an aromatic core such as a phenylene structure or an aromatic group such as a phenyl group in a main or side chain of the resin. When the aromatic epoxy resin is used, the cured product has excellent thermal and chemical stabilities and a low WVTR, and thus reliability of the encapsulating structure for an electronic diode may be enhanced. The aromatic epoxy resin may be, but is not limited to, one or at least two of a biphenyl-type epoxy resin, a naphthalene-type epoxy resin, a dicyclopentadiene-type epoxy resin, a dicyclopentadiene-modified phenol-type epoxy resin, a cresol-based epoxy resin, a bisphenol-based epoxy resin, a xylok-based epoxy resin, a multifunctional epoxy resin, a phenol novolac epoxy resin, a triphenolmethane-type epoxy resin and an alkyl-modified triphenolmethane epoxy resin. In one example, the epoxy resin may be a silane-modified epoxy resin. The silane-modified epoxy resin may be, for example, a reaction product between at least one of the epoxy resins described above and a silane compound. Here, the silane compound may be, for example, a compound represented by Formula 2.

[Formula 2]

In Formula 2, D is a vinyl group, an epoxy group, an amino group, an acryl group, a methacryl group, a mercapto group, an alkoxy group or an isocyanate group, or an alkyl group substituted with at least one of the functional groups, Q is hydrogen, an alkyl group, a halogen, an alkoxy group, an aryl group, an aryloxy group, an acyloxy group, an alkylthio group or an alkyleneoxythio group, and n is a number between 1 and 3.

In the compound of Formula 2, the functional group D may form a silane-modified epoxy resin by a reaction with a functional group included in the epoxy resin.

For example, when the functional group is an amino group, the amino group may form a bond "—CH(OH)—CH$_2$—NH—" by a reaction with an epoxy group of the epoxy resin, and thus the silane compound may be introduced into the epoxy group.

In addition, when the functional group D is an isocyanate or alkoxy group, a silane compound may be introduced by a reaction with an epoxy resin including a hydroxyl (OH) group, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

In Formula 2, the alkyl group may be an alkyl group having 1 to 20, 1 to 16, 1 to 12, 1 to 8 or 1 to 4 carbon atoms. The alkyl group may be a linear, branched or cyclic alkyl group.

In Formula 2, a halogen atom may be fluorine (F), chlorine (Cl), bromine (Br) or iodine (I).

In addition, in Formula 2, the alkoxy group may be an alkoxy group having 1 to 20, 1 to 12, 1 to 8 or 1 to 4 carbon atoms. The alkoxy group may be a linear, branched or cyclic alkoxy group.

In addition, in Formula 2, the aryl group or aryl group included in the aryloxy group may be an aryl group or an aralkyl group. For example, the aryl group may refer to a monovalent residue derived from a compound including at least one benzene ring or a structure in which at least two benzene rings are linked or condensed or a derivative thereof. The aryl group may be, for example, an aryl group having 6 to 25, 6 to 21, 6 to 18 or 6 to 12 carbon atoms. As the aryl group, for example, a phenyl group, a dichlorophenyl group, a chlorophenyl group, a phenylethyl group, a phenylpropyl group, a benzyl group, a tolyl group, a xylyl group or a naphthyl group may be used.

In addition, in Formula 2, the acyloxy group may be an acyloxy group having 1 to 20, 1 to 16 or 1 to 12 carbon atoms.

In addition, in Formula 2, the alkylthio group may be an alkylthio group having 1 to 20, 1 to 16, 1 to 12, 1 to 8 or 1 to 4 carbon atoms, the alkyleneoxythio group may be an alkyleneoxythio group having 1 to 20, 1 to 16, 1 to 12, 1 to 8 or 1 to 4 carbon atoms.

The alkyl, alkoxy, aryl, acyloxy, alkylthio or alkyleneoxythio group may be optionally substituted with at least one substituent. The substituent may be, but is not limited to, a hydroxyl group, an epoxy group, an alkyl group, an alkenyl group, an alkynyl group, an alkoxy group, an acyl group, a thiol group, an acryloyl group, a methacryloyl group, an aryl group or an isocyanate group.

In Formula 2, the functional group D may be, for example, an alkoxy group, an amino group or an isocyanate group among these.

In addition, in Formula 2, at least one, two or three of the functional groups Q may be, for example, a halogen atom, an alkoxy group, an aryloxy group, an acyloxy group, an alkylthio group or an alkyleneoxythio group, or an alkoxy group.

As the silane-modified epoxy group, for example, an epoxy resin into which a silane compound is introduced at approximately 0.1 to 10 parts by weight, 0.1 to 9 parts by weight, 0.1 to 8 parts by weight, 0.1 to 7 parts by weight, 0.1 to 6 parts by weight, 0.1 to 5 parts by weight, 0.1 to 4 parts by weight, 0.1 to 3 parts by weight, 0.3 to 2 parts by weight or 0.5 to 2 parts by weight with respect to 100 parts by weight of the epoxy resin. In one example, the epoxy resin to which the silane compound is introduced may be an aromatic epoxy resin. The aromatic epoxy resin may be, for example, a bisphenol-type epoxy resin such as a bisphenol F-type epoxy resin, a bisphenol F-type novolac epoxy resin, a bisphenol A-type epoxy resin or a bisphenol A-type novolac epoxy resin.

Due to the epoxy resin which is modified by a silane to include a silyl group in its structure, the encapsulating layer of an electronic device may have an excellent adhesive property to a substrate, etc., and excellent moisture blocking property, durability and reliability.

The second layer may further include a curing agent which may form a crosslinking structure by a reaction with a curable resin or an initiator which may initiate a curing reaction of the resin depending on the kind of the curable resin.

A suitable kind of the curing agent may be selected and used according to the kind of the curable resin or a functional group included in the resin.

In one example, when the curable resin is an epoxy resin, as a curing agent, a curing agent for the epoxy resin known in the related art may be used, and may be, but is not limited to, one or at least two of an amine curing agent, an imidazole curing agent, a phenol curing agent, a phosphorus curing agent or an acid anhydride curing agent.

In one example, as the curing agent, an imidazole compound which is solid at room temperature and has a melting point or decomposition temperature of 80° C. or more may be used. Such a compound may be, but is not limited to, 2-methyl imidazole, 2-heptadecyl imidazole, 2-phenyl imidazole, 2-phenyl-4-methyl imidazole or 1-cyanoethyl-2-phenyl imidazole.

A content of the curing agent may be selected according to a composition of the composition, for example, a kind or ratio of the curable resin. For example, the curing agent may be included at 1 to 20, 1 to 10 or 1 to 5 parts by weight with respect to 100 parts by weight of the curable resin. However, the weight ratio may be changed according to the kind and ratio of a curable resin or a functional group of the resin, or a crosslinking density to be realized.

When the curable resin is an epoxy resin which may be cured by radiation of an active energy ray, as an initiator, for example, a cationic photoinitiator may be used.

The cationic photoinitiator may be an onium salt or organometallic salt-based ionized cationic initiator or an organic silane or latent sulfonic acid-based non-ionized cationic photoinitiator. The onium salt-based initiator may be a diaryliodonium salt, a triarylsulfonium salt or an aryldiazonium salt, the organic metal salt-based initiator may be an iron arene, the organic silane-based initiator may be an o-nitrobenzyl triaryl silyl ether, a triaryl silyl peroxide or an acyl silane, and the latent sulfonic acid-based initiator may be α-sulfonyloxy ketone or α-hydroxymethylbenzoin sulfonate, but the present invention is not limited thereto.

In one example, the cationic initiator may be an ionized cationic photo initiator.

A content of the initiator may be changed according to the kind and ratio of a curable resin or a functional group of the resin, or a crosslinking density to be realized like the curing agent. For example, the initiator may be blended at a content of 0.01 to 10 parts by weight or 0.1 to 3 parts by weight with respect to 100 parts by weight of the curable resin. When the content of the curing agent is excessively small, curing may not be sufficiently performed, and when the content of the curing agent is excessively high, a content of an ionic material is increased after curing, and thus the durability of the adhesive is degraded or a conjugate acid is formed due to the characteristic of the initiator, which is inappropriate for optical durability. In addition, depending on a base, corrosion may occur, and therefore a suitable content range may be selected.

The second layer may further include a binder resin. The binder resin may serve to improve moldability when molded in a film or sheet type.

The kind of a binder resin is not particularly limited if a resin has a compatibility with a different resin such as a curable resin. The binder resin may be a phenoxy resin, an acrylate resin or a high molecular weight epoxy resin. Here, the high molecular weight epoxy resin may refer to a resin having a weight average molecular weight of approximately 2,000 to 70,000 or 4,000 or 6,000. The high molecular weight epoxy resin may be a solid bisphenol A-type epoxy resin or a solid bisphenol F-type epoxy resin. As the binder resin, a rubber component such as a high-polarity functional group-containing rubber or a high-polarity functional group-containing reactive rubber may be used. In one example, the binder resin may be a phenoxy resin.

When the binder resin is included, its ratio may be controlled according to a desired physical property, but is not particularly limited. For example, the binder resin may be included at a content of approximately 200, 150 or 100 parts by weight with respect to 100 parts by weight of a curable adhesive component. When the content of the binder resin is 200 parts by weight or less, a compatibility with each component of the second layer may be effectively maintained, and the binder resin may serve as an adhesive layer.

The second layer may further include a moisture blocker. When the moisture scavenger is in contact with a diode including an organic material, it may damage the diode by a chemical reaction with moisture. Accordingly, the second layer may or may not include a trace amount of the moisture scavenger. When the second layer includes a trace amount of the moisture scavenger, a content of the moisture scavenger may be as described above. However, the moisture blocker makes a migration path for moisture longer to block moisture, and since it has a smaller reactivity than the moisture scavenger, it has a lower chance of damaging the diode. A content of the moisture blocker which may be included in the second layer may be, for example, approximately 0.01 to 50 parts by weight or 1 to 30 parts by weight based on 100 parts by weight of the curable resin. A particular kind of the moisture blocker and a method of dispersing the moisture blocker in the curable resin may be understood with reference to the moisture blocker included in the first layer and the method of including the moisture blocker.

The second layer may further include an additive such as a plasticizing agent, a UV stabilizer and/or an antioxidant without affecting a desired effect.

The film may further include a base. The base may be disposed on one or both surfaces of the film. The base may be, for example, a release-treated base, or any one used in the related art without limitation.

The encapsulating film may encapsulate and protect various targets. Particularly, the film may be applied to manufacturing a target including a diode sensitive to an external component, for example, moisture or vapor.

Hereinafter, a method of manufacturing an electronic device by using the film. As an example of the electronic device to which the encapsulating film may be applied, an organic electronic device such as a photovoltaic device, a rectifier, a transmitter or an OLED, a solar cell or a secondary battery may be used, but the present invention is not limited thereto.

The method of manufacturing an electronic device includes laminating the film on a diode such that a second layer of the film is in contact with the diode. Here, the diode may refer to any one part of the electronic device.

In one example, the laminating of the second layer of the film to be in contact with the diode may include contacting the second layer with the diode. The second layer of the film, for example, may be applied so that the film may cover an entire surface of the diode. When film may be applied to cover an entire surface of the diode, the diode cannot be detected from a top view and the entire surface of the diode can be protected from moisture. In addition, as described above, since the second layer includes a trace amount of or no moisture scavenger capable of damaging the diode, it does not influence a function even when the second layer is in contact with the diode.

In another example, when the diode is formed on a bottom substrate, the second layer of the film may be applied to cover an entire surface of the diode and at least a part of the bottom substrate. For example, applying the film to cover at least a part of the bottom substrate may perform such that the film covers an entire surface of the diode and the bottom substrate along an edge of the diode by forming the film and the bottom substrate bigger than the diode. In addition, as described above, the second layer has a step difference compensating property, and thus may be attached to a surface having a height difference such as the bottom substrate having the diode without lifting and/or bubbles. As a result, the electronic device having an excellent interface adhesive strength between the film, the diode and bottom substrate may be provided.

In one example, the laminating of the second layer of the film to be in contact with the diode may include contacting the second layer with the diode and heating the resulting layer. The laminating, for example, may perform by contacting the second layer and diode and pressing the diode while the second layer is heated to provide flowability. In one example, the second layer may be solid or semi-solid at room temperature, and may be heated to maintain a viscosity of $10^3$ to $10^5$ Pa·s at 65° C. and 1 Hz when the second layer is in contact with the diode. When the second layer is the above-described hot melt-type adhesive layer, it may be attached to a surface having a height difference such as the substrate on which the diode is formed without lifting and/or bubbles. Accordingly, even a large-scale electronic device may be provided without degradation in performance due to bubbles.

Here, when the second layer includes a heat-curable resin, the heating may be controlled to a temperature within approximately 40 to 100° C. and a time within 1 to 20 minutes since a cohesive strength and an adhesive strength of the encapsulating layer may be decreased due to over-curing.

In addition, the pressing may be performed in a vacuum state to prevent bubbles from being generated between the diode and the second layer. In one example, the laminating of the second layer to be in contact with the diode may be performed using a vacuum press.

In addition, the method may include curing the second layer after the second layer is stacked to be in contact with the diode. The curing process may be performed in a suitable heating chamber or UV chamber depending on, for example, a method of curing a curable resin. Heating conditions or conditions for radiating an active energy ray may be suitably selected in consideration of stability of the electronic diode and curability of a curable resin composition.

In one example, the curing may be performed such that the second layer has a glass transition temperature of 0° C., 50° C., 70° C., 85° C. or 100° C. or more. Since the first layer may include large amounts of the moisture scavenger, ions generated by a reaction between the moisture scavenger and moisture may migrate to the second layer. However, the second layer may be in contact with the diode, and thus the ions migrating from the first layer to the second layer may influence performance of the diode. For this reason, the second layer may be sufficiently cured, thereby preventing the migration of the ions from the first layer to the second layer, and deterioration of the performance of the diode. That is, the second layer may have the above-described effects by preventing the migration of the ions having a glass transition temperature within in the above range from the first layer to the second layer. That is when the curing is performed such that the second layer has the above range of a glass transition temperature, it can prevent the migration of ions from the first layer to the second layer, and thus the above-described effects can be exhibited.

In one example, the film may be pre-transferred to the upper substrate of the electronic device before laminating. As shown in FIG. 2, the film 24 includes a first layer 12 and a second layer 11, the first layer 12 of the film may be transferred to an upper substrate 21. In one example, when the first layer 12 has a pressure-sensitive adhesive property, it may be attached to the upper substrate 21 by a predetermined pressure. Accordingly, the transfer of the first layer may be performed by roll lamination after the first layer is in contact with the upper substrate 21. Afterward, as described above, the second layer 11 of the film may be stacked on the diode 23.

An electronic device which includes an upper substrate 21; a bottom substrate 22; and a film encapsulating a diode between the upper and bottom substrates may be provided by the method as described above.

In one example, the method of manufacturing an electronic device may be applied to manufacturing an organic electronic device. An encapsulating layer formed by curing the film may exhibit excellent moisture blocking property and optical properties in the organic electronic system, and effectively fix and support the upper substrate and the bottom substrate. In addition, the encapsulating layer may have excellent transparency since the moisture scavenger is prepared in a nano size and uniformly dispersed in the resin, and thus become stable regardless of a shape of the organic electronic system such as a top emission or bottom emission type.

The method may be provided in a conventional configuration known in the related art except that an organic light emitting diode is encapsulated by the above film. For example, in order to prepare a bottom substrate on which OLED is formed, a transparent electrode may be formed on a substrate such as a glass, metal or polymer film by using vacuum deposition or sputtering, and a layer of an organic material may be formed on the transparent electrode. The layer of an organic material may include a hole injection layer, a hole transport layer, an emitting layer, an electron injection layer and/or an electron transport layer. Subsequently, the bottom substrate on which OLED is formed may be prepared by further forming a second electrode on the layer of an organic material. An organic electronic device may be manufactured by using the bottom substrate to which OLED is formed as mentioned above.

The method described above is an example of the method of manufacturing an electronic device, but the present invention is not limited thereto. The process of manufacturing the device may be performed as described above, but a sequence or conditions of the process may be changed.

EFFECT

An electronic device having excellent moisture blocking property and durability may be provided by the method.

DETAILED DESCRIPTION OF EXEMPLARY EMBODIMENTS

Figure 1:
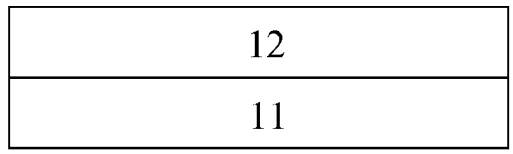
FIG. 1 is a schematic diagram of a film according to an exemplary embodiment.
Figure 2:
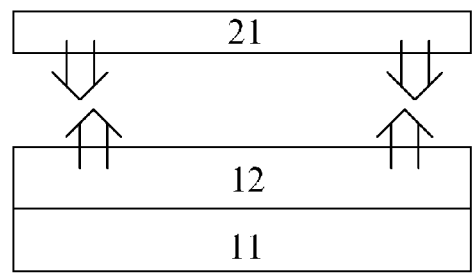
FIG. 2 is a schematic diagram illustrating a method of manufacturing an electronic device according to an exemplary embodiment.
Figure 2:
Figure 2:
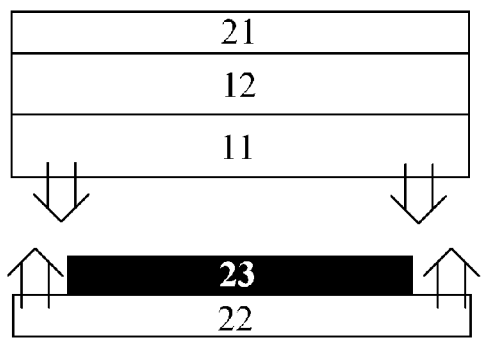
Figure 2:
Figure 2:
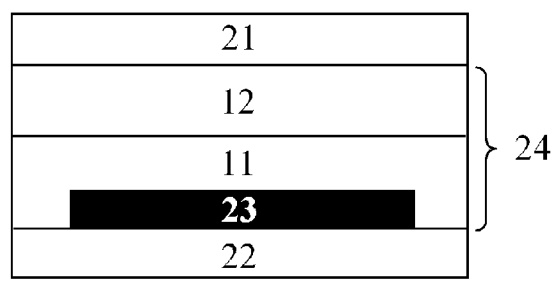

Hereinafter, a method of manufacturing an organic device will be described in further detail with reference to Examples and Comparative Examples, but the scope of the method is not limited to the following Examples.

Hereinafter, physical properties shown in Examples and Comparative Examples are evaluated by the following methods.

1. Measurement of Contact Angle

A contact angle was measured with respect to a coating layer formed by preparing a solution having a solid content of 15 wt % by dissolving a base resin in a dilutable solvent, coating the prepared solution on a glass to have a thickness of 10 nm and drying the coated solution. Particularly, the contact angle was measured using DSA100 produced by KRUSS. Deionized water was dropped to the coating layer at approximately 25° C., which was repeated 10 times, and then an average of the measured results was determined as the contact angle.

2. Measurement of WVTR

A resin composition was prepared by dissolving the component for the first layer used in Example or the resin used in Comparative Example in a solvent. The resin composition was coated on a base film (releasing polyester film, RS-21G, SKC) having a thickness of 38 μm. Subsequently, the coated composition was dried at 110° C. for 10 minutes, and thereby a film-type layer having a thickness of 100 μm was prepared. Afterward, the base film was detached, the film-type layer was maintained at 100° F. and a relative humidity of 100%, and then a WVTR with respect to a thickness direction of the film-type layer was measured. The WVTR was measured as prescribed in regulations of ASTM F1249.

3. Measurement of Tensile Modulus

A resin composition was prepared by dissolving a first or second layer prepared in Example or Comparative Example in a solvent. The resin composition was coated on a base film (releasing polyester film, RS-21G, SKC) having a thickness of 38 μm. Subsequently, the coated composition was dried at 110° C. for 10 minutes, and thereby a film-type layer having a thickness of 40 μm was prepared. The prepared coating layer was designed to be coated in a length direction, and then cut in a size of 50 mm×10 mm (length×width), thereby preparing a specimen. Both terminal ends of the specimen were taped to leave 25 mm in a length direction. Subsequently, while the taped part was extended at 25° C. at a rate of 18 mm/min, a tensile modulus was measured.

4. Evaluation of Moisture Blocking Property

While a specimen formed in Example or Comparative Example was maintained in a constant temperature and constant humidity chamber at 85° C. and a relative humidity of 85% for approximately 500 hours, a length of the calcium-deposited part which was oxidized and made transparent was measured. Since calcium had a total length in one direction of 10 mm, the length of the oxidized part of the calcium from one terminal end became 5 mm, which meant that all of the calcium was oxidized.

5. Evaluation of Durability and Reliability

While a specimen formed in Example or Comparative Example was maintained in a constant temperature and constant humidity chamber at 85° C. and a relative humidity of 85% for approximately 500 hours, it was observed whether or not lifting occurred at an interface between the glass substrate and the encapsulating layer.

6. Evaluation of Applicability of Panel

It was observed with the unaided eye whether or not bubbles were generated in a specimen formed in Example or Comparative Example.

Example 1

(1) Preparation of Encapsulating Film

1) Preparation of First Layer Solution

A moisture scavenger solution was prepared by adding 100 g of calcined dolomite as a moisture scavenger and 0.5 g of stearic acid as a dispersing agent to a toluene to have a solid content of 50 wt %. In addition, separately, 65 g of a polyisobutene resin (weight average molecular weight of 450,000) and 5 g of a maleic acid anhydride-grated styrene-ethylene-butadiene-styrene block copolymer (MA-SEBS, Product Name: FG-1901X, Manufacturer: Kraton) were added as base resins for the first layer to a reaction vessel at room temperature, and 30 g of a hydrogenated dicyclopentadiene-based resin (softening point: 125° C.) was added thereto as a tackifier and diluted with toluene to have a solid content of approximately 20 wt %. The previously prepared moisture scavenger solution was added to the solution to have a content of the calcined dolomite of 30 parts by weight with respect to 100 parts by weight of the base resins for the first layer, and mixed together, thereby preparing a first layer solution.

2) Preparation of Second Layer Solution 200 g of a silane-modified epoxy resin (KSR-177, Kukdo Chemical) and 150 g of a phenoxy resin (YP-50, Tohto Kasei) were added to a reaction vessel at room temperature, and then diluted with methylethylketone. 4 g of imidazole (Shikoku Chemical) which was a curing agent was added to the homogenized solution, and stirred at a high speed for 1 hour, thereby preparing a second layer solution.

3) Formation of Film

A first layer was formed to have a thickness of 40 μm by coating the solution of a first layer prepared above on a release surface of releasing PET and drying the coated solution at 110° C. for 10 minutes.

A second layer was formed to have a thickness of 15 μm by coating the solution of a second layer prepared above on a release surface of releasing PET and drying the coated solution at 130° C. for 3 minutes.

A multilayer film was formed by laminating the first and second layers.

(2) Preparation of Specimen

Calcium (Ca) was deposited on a glass substrate having a size of 12 mm×12 mm (length×width) to have a size of 10 mm×10 mm (length×width). Separately, a film formed in the above was cut to a size of 12 mm×12 mm (length×width). Subsequently, the first layer of the film was transferred to a cover glass. Afterward, an opposite surface to that of the film on which the cover glass was disposed was laminated on the calcium of the glass substrate, and thermally pressed using a vacuum press at 80° C. for 2 minutes, and cured at 100° C. for 3 hours, thereby forming an encapsulating layer. Thus, a specimen was manufactured.

Example 2

A film and a specimen were prepared as described in Example 1, except that 60 g of polyisobutene and 10 g of MA-SEBS were used instead of 65 g of polyisobutene and 5 g of MA-SEBS as PSA component of the first layer of the film.

Example 3

A film and a specimen were prepared as described in Example 1, except that 55 g of polyisobutene and 15 g of MA-SEBS were used instead of 65 g of polyisobutene and 5 g of MA-SEBS as PSA component of the first layer of the film.

Example 4

A film and specimen were prepared as described in Example 2, except that a styrene-butadiene-styrene block copolymer (SBS, Product Name: D-1101, Manufacturer: Kraton) was used instead of MA-SEBS of the PSA components for the first layer.

Example 5

A film and specimen were prepared as described in Example 2, except that a styrene-isoprene-styrene block copolymer (SIS, Product Name: D-1107, Manufacturer: Kraton) was used instead of MA-SEBS of the PSA components for the first layer.

Example 6

A film and a specimen were prepared as described in Example 2, except that 70 g of a polyisobutene resin was used instead of 60 g of a polyisobutene resin and 10 g of MA-SEBS as PSA components for the first layer.

Comparative Example 1

A specimen was prepared as described in Example 1, except that a second layer of a film was in contact with an upper substrate.

Comparative Example 2

A specimen was prepared as described in Example 1, except that a bottom substrate having calcium was in contact with a second layer of the film before a first layer was attached to an upper substrate, and then thermally pressed and cured.

TABLE 1

| | | Contact Angle[a] | WVTR[b] | M1[c] | M2[d] | Tg 1[e] | Tg 2[f] |
|---|---|---|---|---|---|---|---|
| EXAMPLE | 1 | 108 | 7.8 | 0.5 | 680 | −60 | 101 |
| | 2 | 103 | 7.8 | 0.71 | 680 | −57 | 101 |
| | 3 | 101 | 41.0 | 0.76 | 680 | −55 | 101 |
| | 4 | 110 | 10.0 | 0.6 | 680 | −62 | 101 |
| | 5 | 109 | 9.3 | 0.69 | 680 | −59 | 101 |
| | 6 | 111 | 3.2 | 0.5 | 680 | −65 | 101 |

[a]Contact Angle (Unit: °) of PSA component of First Layer
[b]WVTR (Unit: g/m² · day) of PSA component of First Layer
[c]Tensile Modulus (Unit: MPa) of First Layer
[d]Tensile Modulus (Unit: MPa) of Second Layer
[e]Glass Transition Temperature (Unit: ° C.) of PSA component of First Layer After Curing
[f]Glass Transition Temperature (Unit: ° C.) of Adhesive component of Second Layer After Curing
*C. EXAMPLE: Comparative Example

TABLE 2

| | | Moisture Blocking Property[g] | Durability and Reliability | Possibility to Apply Panel |
|---|---|---|---|---|
| EXAMPLE | 1 | 2.7 | Good | No Bubbles |
| | 2 | 3.1 | Good | No Bubbles |
| | 3 | 3.3 | Good | No Bubbles |
| | 4 | 2.8 | Good | No Bubbles |
| | 5 | 2.8 | Good | No Bubbles |
| | 6 | 2.5 | Good | No Bubbles |
| C. EXAMPLE | 1 | 2.4 | Destroyed | Bubbles |
| | 2 | 2.7 | Good | Bubbles |

[g]Length of calcium oxidized in one direction from one surface (Unit: mm)
*C. EXAMPLE: Comparative Example

What is claimed is:

1. A method of manufacturing an organic electronic device, comprising:
   laminating an encapsulating film onto a surface of the organic electronic device, wherein the encapsulating film is formed by a first layer comprising a first adhesive component and a second layer comprising a second adhesive component, wherein the first and second adhesive components are different, and the laminating comprising placing the encapsulating film onto the organic electronic device such that the second layer is in contact with the organic electronic device, and the first layer is not in contact with the organic electronic device,
   wherein the first adhesive component of the first layer comprises polyisobutene resin, the first layer further comprising a tackifier, and wherein the first layer comprises 5 to 250 parts by weight of a moisture scavenger relative to 100 parts by weight of the first adhesive component; and
   wherein the second layer comprises less than 5 parts by weight of the moisture scavenger relative to 100 parts by weight of a solid content of the second layer.

2. The method according to claim 1, wherein the laminating of the second layer to be in contact with the organic electronic device includes contacting the second layer with the organic electronic device and heating the second layer.

3. The method according to claim 2, wherein the second layer is in contact with the organic electronic device to cover an entire surface of the organic electronic device.

4. The method according to claim 3, wherein the organic electronic device is formed on a bottom substrate and the second layer is in contact with the organic electronic device to cover an entire surface of the organic electronic device and at least a part of the bottom substrate.

5. The method according to claim 2, wherein the second layer is solid or semi-solid at room temperature, and heated to maintain a viscosity of $10^3$ to $10^5$ Pas at the time to be in contact with the organic electronic device.

6. The method according to claim 2, wherein the heating is performed at 40 to 100° C.

7. The method according to claim 1, wherein the laminating of the second layer on the organic electronic device to be in contact with the organic electronic device is performed in a vacuum state.

8. The method according to claim 7, wherein the laminating of the second layer on the organic electronic device to be in contact with the organic electronic device is performed using a vacuum press.

9. The method according to claim 1, further comprising:
curing the second layer after the second layer is laminated on the organic electronic device to be in contact with the organic electronic device.

10. The method according to claim 9, wherein the curing of the second layer is performed such that the second layer has a glass transition temperature of 0° C. or more after curing.

11. The method according to claim 1, further comprising:
transferring the first layer to an upper substrate before the second layer is laminated on the organic electronic device to be in contact with the organic electronic device.

12. The method according to claim 11, wherein the transferring of the first layer to the upper substrate is performed by contacting the first layer with the upper substrate and performing roll lamination.

13. The method according to claim 1, wherein the organic electronic device is an organic light emitting diode.

14. The method according to claim 1, wherein the moisture scavenger comprises a metal oxide, a sulphate, an organic metal oxide, or a combination thereof.

15. The method according to claim 14, wherein the moisture scavenger comprises magnesium oxide, calcium oxide, strontium oxide, barium oxide, aluminum oxide, magnesium sulphate, sodium sulphate, nickel sulphate, aluminum oxide octylate, or a combination thereof.

16. The method according to claim 14, wherein the moisture scavenger comprises calcined dolomite.

17. The method according to claim 14, wherein the first layer further comprises a moisture blocker.

18. The method according to claim 1, wherein the second layer comprises a moisture blocker.

19. The method according to claim 1, wherein the first adhesive component has a contact angle of 80° or more with respect to deionized water.

20. The method according to claim 1, wherein the first adhesive component has a water vapor transmission rate of 50 g/m² day or less.

21. The method according to claim 1, wherein the first adhesive component has a weight average molecular weight of 100,000 to 2,000,000.

22. The method according to claim 1, wherein the tackifier comprises a hydrogenated petroleum.

23. The method according to claim 1, wherein the second adhesive component of the second layer comprises a silane-modified epoxy resin.

24. The method according to claim 1, wherein the second layer further comprises a binder resin.

25. The method according to claim 24, wherein the binder resin comprises a phenoxy resin.

26. The method according to claim 1, wherein the first adhesive component of the first layer further comprises a styrene block copolymer.

27. The method according to claim 26, wherein the styrene block copolymer is a styrene-ethylene-butadiene-styrene block copolymer.

28. The method according to claim 26, wherein the styrene block copolymer is a maleic acid anhydride styrene-ethylene-butadiene-styrene block copolymer.

29. The method according claim 1, wherein the first layer has a lower tensile modulus than the second layer, the tensile modulus being measured after curing at 25° C., the tensile modulus of the first layer is approximately 0.001 to 100 Mpa and the tensile modulus of the second layer is approximate 200 to 1000 Mpa.

30. The method according claim 1, wherein the first adhesive component is a pressure sensitive adhesive composition, and the second adhesive component is a hot-melt adhesive composition.

31. The method according claim 1, wherein the second adhesive component comprises an epoxy resin.

32. The method according claim 1, wherein the second adhesive component of the second layer does not comprise polyisobutene resin.

33. The method according claim 1, wherein the first adhesive component of the first layer does not comprise epoxy resin.

34. A method of manufacturing an organic electronic device, comprising:
laminating an encapsulating film onto a surface of the organic electronic device, wherein the encapsulating film is formed by a first layer including a pressure sensitive adhesive component and a second layer including an adhesive component, and the laminating comprising placing the encapsulating film onto the organic electronic device such that the second layer is in contact with the organic electronic device, and the first layer is not in contact with the organic electronic device,
wherein the pressure sensitive adhesive component of the first layer comprises polyisobutene resin and the adhesive component of the second layer does not comprise polyisobutene resin, the first layer further comprising a tackifier, and wherein the first layer comprises 5 to 250 parts by weight of a moisture scavenger relative to 100 parts by weight of the pressure sensitive adhesive component; and
wherein the second layer comprises less than 5 parts by weight of the moisture scavenger relative to 100 parts by weight of a solid content of the second layer.

35. The method of claim 34, wherein the pressure sensitive adhesive component of the first layer does not comprise epoxy resin.

* * * * *